United States Patent [19]

Homma

[11] Patent Number: 5,288,518
[45] Date of Patent: Feb. 22, 1994

[54] CHEMICAL VAPOR DEPOSITION METHOD FOR FORMING FLUORINE CONTAINING SILICON OXIDE FILM

[75] Inventor: Tetsuya Homma, Tokyo, Japan

[73] Assignee: NEC Corproation, Tokyo, Japan

[21] Appl. No.: 894,584

[22] Filed: Jun. 5, 1992

[30] Foreign Application Priority Data

Jun. 7, 1991 [JP] Japan ............................ 3-136426

[51] Int. Cl.$^5$ ...................... C23C 16/40; C23C 16/50
[52] U.S. Cl. ................... 427/255.1; 427/255.3; 427/573; 427/574
[58] Field of Search ............... 427/255.1, 255.3, 573, 427/574, 595

[56] References Cited

U.S. PATENT DOCUMENTS

| | | | |
|---|---|---|---|
| 4,683,024 | 7/1987 | Miller et al. | 427/534 |
| 4,708,884 | 11/1987 | Chandross et al. | 427/255.3 |
| 4,791,005 | 12/1988 | Becker et al. | 427/255.3 |
| 4,894,352 | 1/1990 | Lane et al. | 427/578 |

OTHER PUBLICATIONS

Journal of Electronic Materials, vol. 19, No. 1. 1990 "Ozone/Organic-Source APCVD for Conformal Doped Oxide Films" by Y. Ikeda et al.

*Primary Examiner*—Shrive Beck
*Assistant Examiner*—Bret Chen
*Attorney, Agent, or Firm*—Burns, Doane, Swecker & Mathis

[57] ABSTRACT

A chemical vapor deposition method for forming a fluorine-containing silicon oxide film comprises introducing a gaseous mixture of alkoxysilane or its polymers as a source gas with fluoroalkoxysilane added thereto into a reaction chamber and performing decomposition of the gaseous mixture to deposit the fluorine-containing silicon oxide film onto a substrate. During the formation of the fluorine-containing silicon oxide film, at least one of compounds containing phosphorus or boron such as organic phosphorus compounds and organic boron compounds may be evaporated and introduced into said gaseous mixture, thereby adding at least one of phosphorus and boron to said fluorine-containing silicon oxide film. The fluorine-containing oxide film may be formed by effecting the decomposition of the gaseous mixture in the presence of ozone gas, or under ultraviolet radiation, or gas plasma.

8 Claims, 3 Drawing Sheets

CHEMICAL VAPOR DEPOSITION METHOD FOR FORMING FLUORINE CONTAINING SILICON OXIDE FILM

BACKGROUND OF THE INVENTION

1. Field of the Invention

The present invention relates to a chemical vapor deposition method, and more particularly to a method for forming a silicon oxide film.

2. Description of Related Art

There has been a conventional chemical vapor deposition method where a silicon oxide film is formed by using tetra-ethyl orthosilicate, $Si(OC_2H_5)_4$, as a source gas and decomposing it at atmospheric pressure. For example, tetra-ethyl orthosilicate as a source gas and trimethoxy phosphate, $PO(OCH_3)_3$, and trimethoxyboron, $B(OCH_3)_3$, as doping gases are introduced into a chamber, mixed with an ozone gas produced by an ozone generator, and decomposed to form a silicon oxide film doped with phosphorus and boron. Alternatively, the formation of silicon oxide films is performed without using any doping gas [Journal of Electronic Materials. Vol. 19. No. 1 (1990) pp. 45–49].

The conventional method of forming the silicon oxide films in the presence of ozone gas as described above has the following problems. First, it cannot be said that the resultant films are of good quality in spite of so high temperature for forming the films as in the range of 350° to 400° C. This may be attributed to the high decomposition temperature of the source gas rendering the condensation polymerization insufficient, and therefore, even such a temperature as in such range cannot allow production of a high quality silicon oxide film. Secondly, the silicon oxide films produced according to the prior art have a strong internal tensile stress of about $1 \times 10^9$ dyn/cm$^2$, and because of the high film forming temperature of 350° to 400° C., a thick film or a multilevel film formed is susceptible to cracks due to thermal stress so that they are unsuited to practical use. Thirdly, owing to the high film forming temperature, for example, when the films are produced on the top of an aluminum wiring, protrusions so-often called hillocks may be produced on the surfaces of the aluminum wirings causing electrical shorts between the wiring and the overlying one, thereby markedly lowering production yield.

SUMMARY OF THE INVENTION

It is, therefore, an object of the present invention to provide an improved method for forming a silicon oxide film which overcomes the problems existing in the conventional chemical vapor deposition method as described above.

A chemical vapor deposition method according to the present invention is characterized by using alkoxysilane, $Si(OR)_4$ where R is an alkyl radical group, or its polymers as a source gas and adding thereto fluoroalkoxysilane, $Si(OR')_n F_{4-n}$ where R' is an alkyl radical group and n is an integer of 1 to 3, to form a fluorine-containing silicon oxide film at lower temperatures.

In an embodiment of the present invention, there is provided a chemical vapor deposition method characterized in that during the above-mentioned fluorine-containing silicon oxide deposition, at least one of phosphorus containing compounds and boron containing compounds such as organic phosphorus and organic boron compounds is vaporized and used as doping gas and phosphorus and/or boron is added to the fluorine-containing silicon oxide film.

In another embodiment of the present invention, there is provided a chemical vapor deposition method characterized by forming the fluorine-containing silicon oxide film in the presence of ozone gas, or under ultraviolet radiation or gas plasma.

BRIEF DESCRIPTION OF THE DRAWINGS

The above objects, features and advantages of the present invention will be apparent from the following description of preferred embodiments according to the present invention with reference to the accompanying drawings, in which.

PREFERRED EMBODIMENTS OF THE INVENTION

Figure 1:
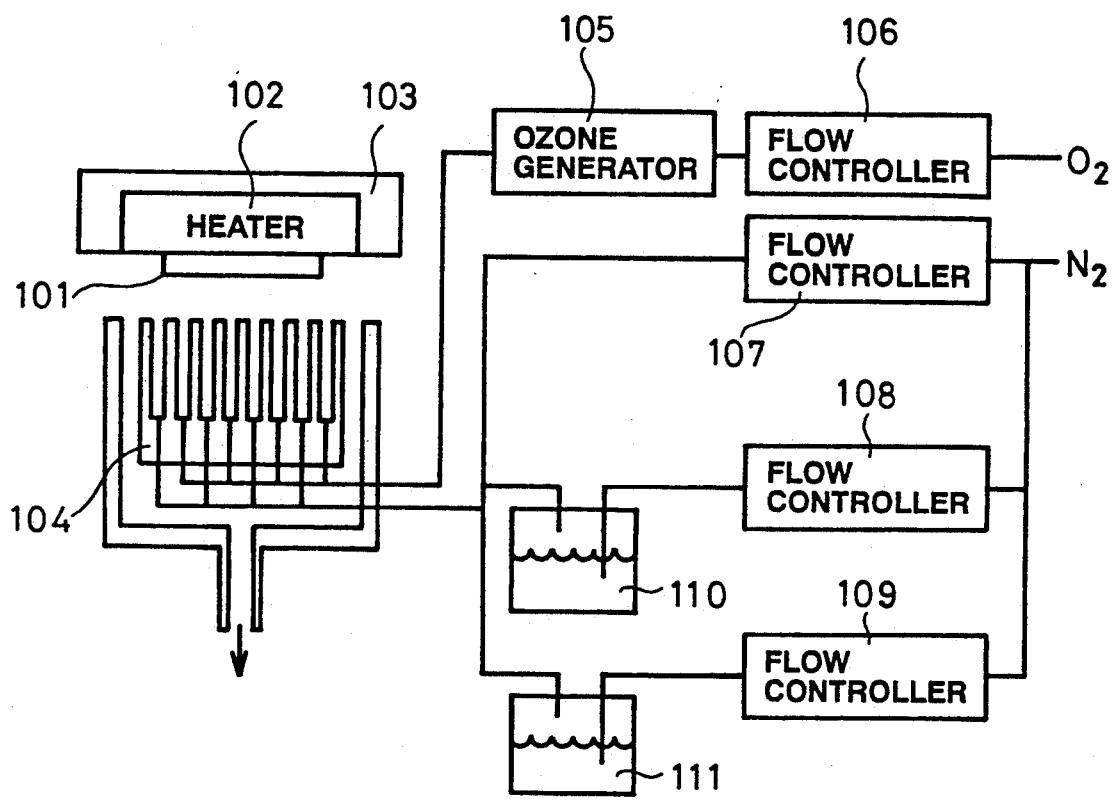
FIG. 1 is a schematic drawing of an apparatus which is used for the formation of the fluorine-containing silicon oxide film according to the first embodiment of the present invention.

The present invention is described with reference to the accompanying drawings. FIG. 1 is a schematic drawing of an apparatus used for the formation of the fluorine-containing silicon oxide film according to the first embodiment of the present invention. A flow of oxygen gas is controlled at a flow rate of 10 SLM by a flow controller 106 and introduced into an ozone generator 105, where ozone is generated at a concentration of about 20,000 ppm, and introduced into a reaction chamber through a dispersion head 104. At the same time, a flow of nitrogen gas is controlled at a flow rate of 2 SLM by a controller 107. Another flow of nitrogen gas is divided into two parts, one of which is controlled at a flow rate of 2 SLM by a controller 108 and bubbled in a bubbler 110 containing tetra-ethyl orthosilicate, $Si(OC_2H_5)_4$, maintained at a temperature of 60° C. to vaporize the same, and the other of which is controlled at a flow rate of 2 SLM by a controller 109 and bubbled in a bubbler 111 containing fluorotriethoxysilane, $FSi(OC_2H_5)_3$, maintained at a temperature of 60° C. to vaporize the same. The nitrogen gas flows from the controller 107 and the bubblers are introduced into the reaction chamber through the dispersion head 104. These gases are mixed in the reaction chamber, decomposed, and deposited onto a semiconductor substrate 101 placed on a susceptor 103 which is maintained at 200° C. by heating with a heater 102.

By the apparatus as described above, a fluorine-containing silicon oxide film having a thickness of about 1 μm was formed on a silicon substrate and examined for its characteristics. First, the examination for film composition by X-ray photoelectron spectrometry revealed that the film had a composition of $SiO_{1.85}F_{0.15}$ and a substantially uniform distribution of fluorine atoms in the direction of the thickness. Next, the film was examined for physical, chemical and electric properties. The film had a refractive index of about 1.425 which is smaller than that of the prior art film of 1.45.

Figure 2:
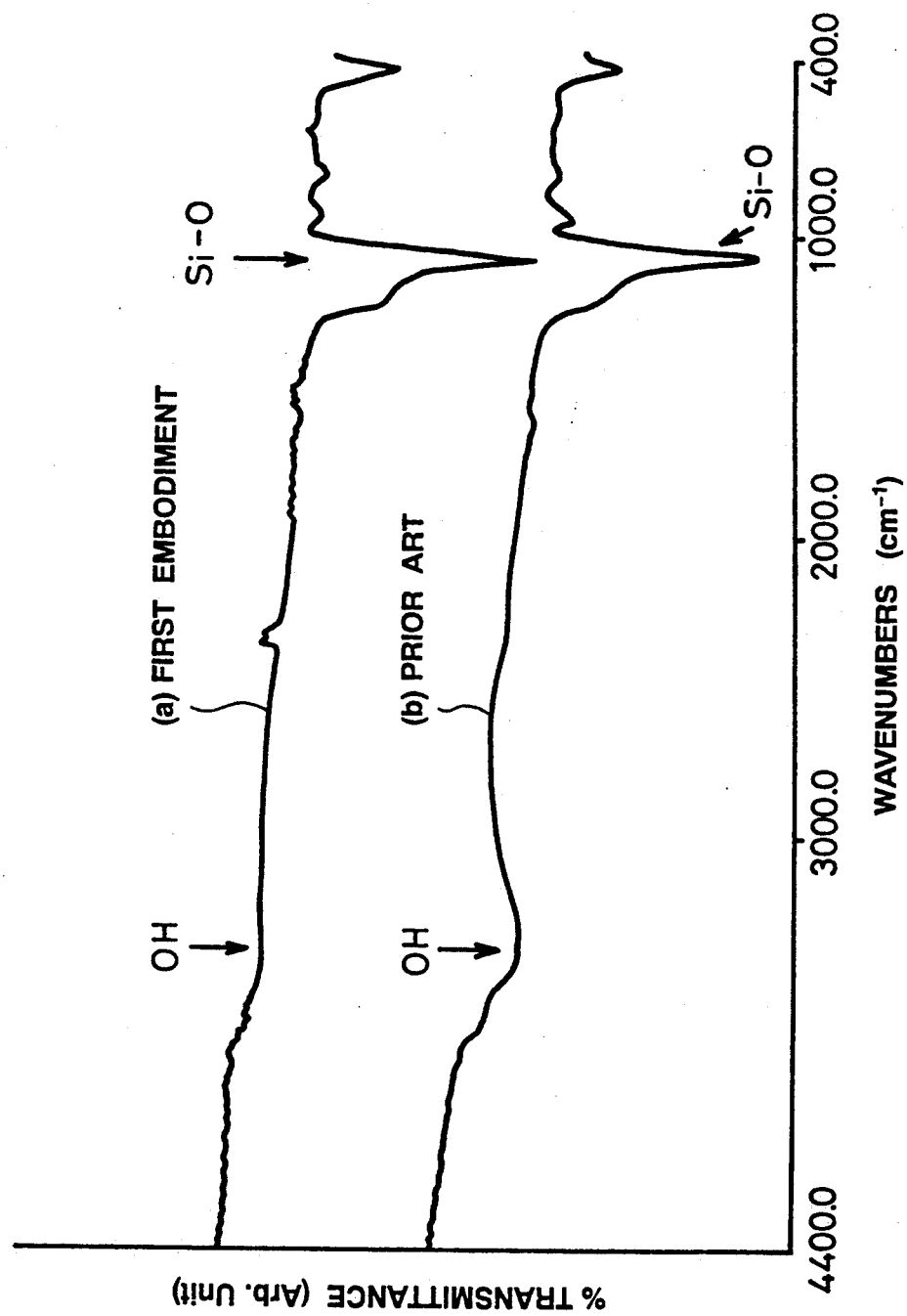
FIG. 2 is a graph showing a comparison in Fourier transform infrared absorption between the present invention and the prior art.

FIG. 2 is a graph showing a comparison in Fourier transform infrared absorption between an example of the present invention and the prior art. There are shown (a) an infrared absorption spectrum of the fluorine-containing oxide film formed on a silicon substrate at a substrate temperature of 200° C. according to the example of the present method and (b) that of the silicon oxide film containing no fluorine which was formed at a substrate temperature of 400° C. according to the prior art. As can be seen from the Figure, the fluorine-containing silicon oxide film of this example has the absorption peak corresponding to a Si—O bond at a wavenumber of about 1080 cm$^{-1}$ which is higher than a wavenumber of about 1067 cm$^{-1}$ at which the silicon oxide film produced by the prior art has the absorption peak corresponding to a Si—O bond. This indicates that the Si—O bond in the fluorine-containing silicon oxide film according to this example is stronger than that of the silicon oxide film formed according to the prior art.

Similarly, it can be appreciated from FIG. 2 that the magnitude of the absorption peak corresponding to an OH group appearing in the vicinity of a wavenumber of 3400 cm$^{-1}$ is smaller in the case of the fluorine-containing silicon oxide film of this example than in the prior art silicon oxide film. This indicates that the fluorine-containing silicon oxide film of the example has a lower water content. The results thus obtained from the infrared absorption spectra indicate that the fluorine-containing silicon oxide film formed even at a lower temperature of 200° C. according to this example is superior in quality to the prior art silicon oxide film formed at a higher temperature of 400° C.

Moreover, the fluorine-containing silicon oxide film according to this example was examined for etching rate with a buffered solution of hydrofluoric acid of 1:30. It exhibited an etching rate of about 800 Å/min, whereas the silicon oxide film of the prior art did an etching rate of about 1000 Å/min. in the identical examination. This indicates that the fluorine-containing silicon oxide film of this example has a higher density than that of the silicon oxide film formed by the prior art. The fluorine-containing silicon oxide film of this example had an internal stress of $2 \times 10^8$ dyn/cm$^2$ which was lower by one order of magnitude than that of the prior art silicon oxide film of $1 \times 10^9$ dyn/cm$^2$.

The films were checked for electrical properties with aluminum electrodes of an area of about 4 mm$^2$ being formed on the films. When a voltage of 5 V was applied onto the samples, the fluorine-containing silicon oxide film of this example exhibited a leakage current density of about $5 \times 10^{-11}$ A/cm$^2$ which was lower than that of the prior art silicon oxide film of about $2 \times 10^{-10}$ A/cm$^2$. Furthermore, the fluorine-containing silicon oxide film of this example had a lower dielectric constant of about 3.7 obtained from the capacitance-voltage measurement at a frequency of 1 MHz, as compared with the prior art silicon oxide film having a dielectric constant of 4.1.

Figure 3:
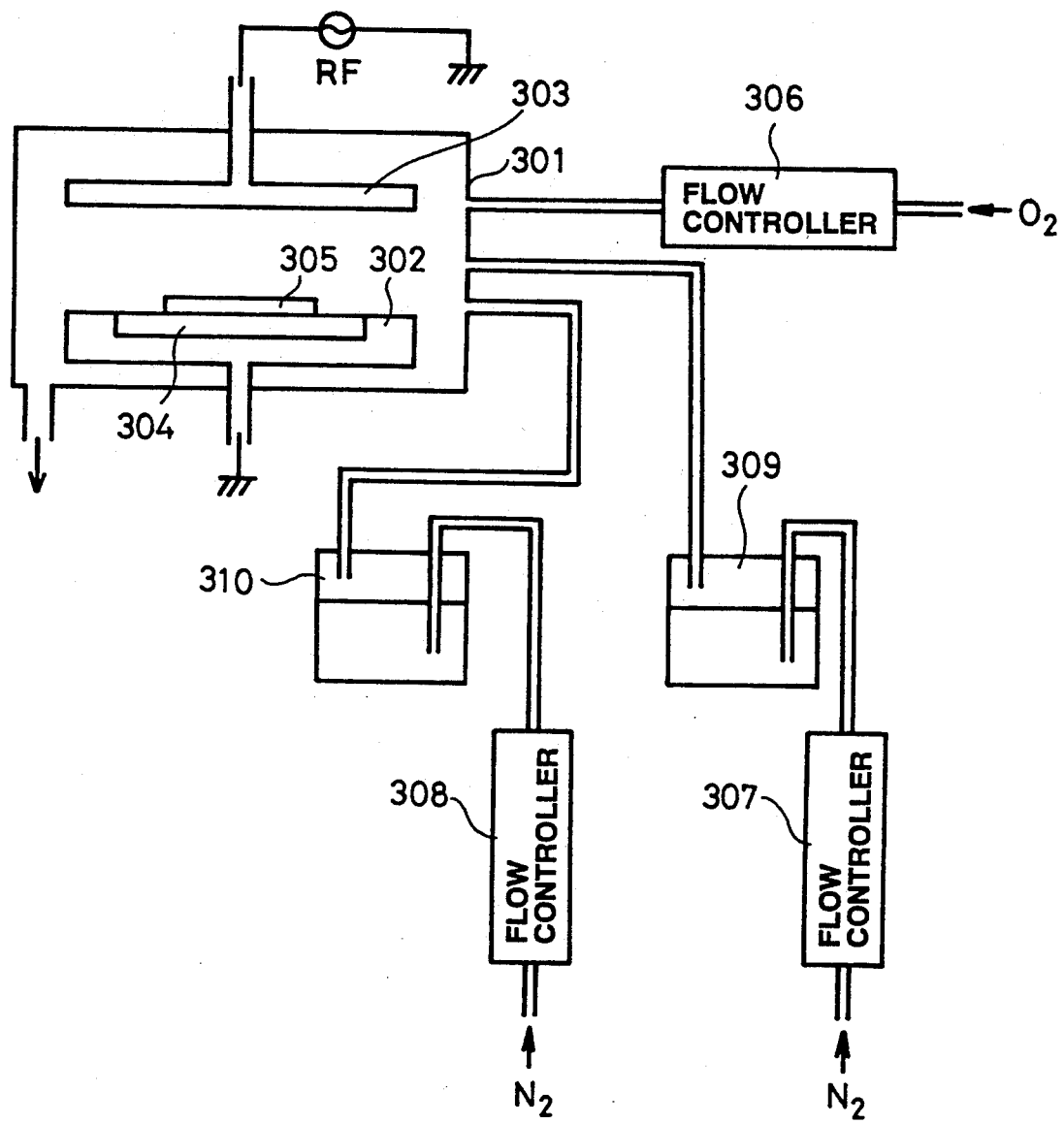
FIG. 3 is a schematic drawing of an apparatus for a Plasma Enhanced Chemical Vapor Deposition which is used for the formation of the fluorine-containing silicon oxide film according to the second embodiment of the present invention.

Next, another example of the present invention will be described with reference to the drawings. FIG. 3 is a schematic drawing of an apparatus for a Plasma Enhanced Chemical Vapor Deposition which was used for the formation of the fluorine-containing silicon oxide film according to the second embodiment of the present invention. In the Figure, a reaction chamber 301 is evacuated to a predetermined constant pressure and an oxygen gas is introduced into the reaction chamber 301 through a flow controller 306. A cathode electrode 303 is supplied with a high frequency power of 13.56 MHz. An anode electrode 302 is grounded and a semiconductor substrate 305 is maintained at a predetermined temperature by a heater 304. As reaction gases, tetra-ethyl orthosilicate, Si(OC$_2$H$_5$)$_4$ and fluorotriethoxysilane, FSi(OC$_2$H$_5$)$_3$, are evaporated in bubblers 309 and 310, respectively, and introduced into the reaction chamber. Nitrogen gas is introduced into the bubblers 309 and 310 through flow controllers 307 and 308, respectively.

In this example, there was produced a fluorine-containing silicon oxide film having a thickness of about 1 μm under the film forming conditions of a substrate temperature of 200° C., a pressure inside the reaction chamber of 0.3 Torr and a high frequency power density of 0.5 W/cm$^2$. The fluorine-containing silicon oxide film thus formed was evaluated for film properties. As a result, there were obtained the same results as those in the first example.

Although in both the first example and the second one no dopant was introduced into the fluorine-containing silicon oxide film, if necessary, an organic compound containing at least one of phosphorus and boron such as trimethoxy phosphate, PO(OCH$_3$)$_3$, or trimethoxy boron, B(OCH$_3$)$_3$, may be similarly evaporated by bubbling and used as doping gas for adding at least one of phosphorus and boron to the fluorine-containing silicon oxide film. In addition, the film forming temperature may be above 200° C. and other film forming conditions may be changed, if necessary. It should be understood that the present invention can be applied to methods other than those described in the examples such as a plasma-assisted method, a thermal chemical vapor deposition method and a photochemical vapor deposition method using ultraviolet radiation.

As described above, the present invention enables deposition of a silicon oxide film having superior film characteristics at lower temperatures by a chemical vapor deposition method with organic sources, in which fluoroalkoxysilane is added. Despite the formation at lower temperatures, the water content can be reduced. Thus, the use of the film in semiconductor devices allows the reliability thereof to be markedly enhanced.

When the films are used as insulating films interposed between layers in a multilevel interconnection with aluminum wirings and the like, a thick film can be formed without causing any crack, and moreover, no aluminum hillock is formed, since the films are produced at lower temperatures, highly dense and less stressed. Therefore, the present invention has advantages of increasing the production yield of semiconductor devices having a multilevel interconnection as well as enhancing the reliability thereof.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A chemical vapor deposition method for forming a fluorine-containing silicon oxide film comprising introducing a gaseous mixture of alkoxysilane as a source gas with fluoroalkoxysilane added thereto into a reaction chamber and performing decomposition of the gaseous mixture to deposit the fluorine-containing silicon oxide film onto a substrate.

2. The method according to claim 1, in which said alkoxysilane is represented by the general chemical formula, $Si(OR)_4$, where R is an alkyl radical group.

3. The method according to claim 2, in which said alkoxysilane is tetra-ethyl orthosilicate.

4. The method according to claim 1, in which said fluoroalkoxysilane is represented by the general chemical formula, $Si(OR')_n F_{4-n}$, where R' is an alkyl radical group and n is an integer of 1 to 3.

5. The method according to claim 4, in which said fluoroalkoxysilane is fluorotriethoxysilane.

6. The method according to claim 1, in which during the formation of said fluorine-containing silicon oxide film, at least one compound containing phosphorus or boron is evaporated and introduced into said gaseous mixture, thereby adding at least one of said phosphorus or boron to said fluorine-containing silicon oxide film.

7. The method according to claim 6, in which said at least one compound containing phosphorus or boron is selected from the group consisting of trimethoxy phosphate, $PO(OCH_3)_3$, and trimethoxyboron, $B(OCH_3)_3$.

8. The method according to claim 1, in which said decomposition of the gaseous mixture to deposit the fluorine-containing silicon oxide film onto a substrate is performed at a temperature lower than about 200° C.

* * * * *